United States Patent [19]

Ando et al.

[11] Patent Number: 4,695,826
[45] Date of Patent: Sep. 22, 1987

[54] HIGH ACCURACY DIGITAL-TO-ANALOG CONVERTER HAVING SYMMETRICAL CURRENT SOURCE SWITCHING

[75] Inventors: Hideki Ando; Takahiro Miki, both of Itami, Japan

[73] Assignee: Mitsubishi Denki Kabushiki Kaisha, Tokyo, Japan

[21] Appl. No.: 848,562

[22] Filed: Apr. 7, 1986

[30] Foreign Application Priority Data

Apr. 17, 1985 [JP] Japan ................................ 60-82930

[51] Int. Cl.$^4$ .............................................. H03M 1/74
[52] U.S. Cl. ...................... 340/347 DA; 340/347 CC; 340/347 M; 323/317
[58] Field of Search .... 340/347 DA, 347 M, 347 CC; 323/312, 317

[56] References Cited

U.S. PATENT DOCUMENTS

| | | | |
|---|---|---|---|
| Re. 31,850 | 3/1985 | Pastoriza | 340/347 DA |
| 3,217,147 | 11/1965 | Chapman, Jr. | 340/347 M X |
| 3,995,304 | 11/1976 | Pease | 357/36 |
| 4,056,740 | 11/1977 | Schoeff | 340/347 DA X |
| 4,309,693 | 1/1982 | Craven | 340/347 DA |
| 4,468,652 | 8/1984 | Wang et al. | 340/347 DA |
| 4,521,764 | 6/1985 | Burton | 340/347 DA |
| 4,521,765 | 6/1985 | Wang et al. | 340/347 DA |

FOREIGN PATENT DOCUMENTS

| | | |
|---|---|---|
| 0095674 | 12/1983 | European Pat. Off. . |
| 0102609 | 3/1984 | European Pat. Off. . |
| 1517199 | 7/1978 | United Kingdom . |
| 2080059 | 7/1980 | United Kingdom . |
| 2047998 | 12/1980 | United Kingdom . |

OTHER PUBLICATIONS

The Engineering Staff of Analog Devices, Inc., Analog-Digital Conversion Handbook, 6/1972, pp. II-46 to II-49.
Bob Peterson, *Inherently Monotonic DAC-IC Design Eliminates Costly Resistor Matching*, Electronic Design News, vol. 24, No. 5 (Mar. 5, 1979): 46, 50.

*Primary Examiner*—T. J. Sloyan
*Attorney, Agent, or Firm*—Lowe Price Leblanc Becker & Shur

[57] ABSTRACT

A digital-to-analog converter includes a plurality of constant current sources (401–407) arrayed in a prescribed order and connected with a grounding lead wire (70). The respective constant current sources (401–407) are selectively connected to a first bus (303) by corresponding switches (501–507), respectively. A decoder (2) outputs switching signals to the switches (501–507). The switching signals are outputted from the decoder (2) to the switches (501–507) so that the constant current sources symmetrically positioned with respect to the center of an array of the plurality of constant current sources (401–407) are sequentially connected to the first bus (303). Thus, the digital-to-analog converter is improved in linearity.

4 Claims, 5 Drawing Figures

CONSTANT CURRENT SOURCE NUMBER

DIGITAL-TO-ANALOG CONVERTER

BACKGROUND OF THE INVENTION

1. Field of the Invention

The present invention relates to an improvement in a digital-to-analog converter.

2. Description of the Prior Art

FIG. 1 is a connection diagram showing an exemplary construction of a conventional digital-to-analog converter. Referring to FIG. 1, numeral 1 indicates three input terminals for receiving bits which are represented by $D_2$, $D_1$ and $D_0$ respectively. In the example as shown in FIG. 1, the input digital signal is binary codes of the bit number n=3, and hence outputted is an analog signal of eight stages (generally $2^n$ stages). Numeral 2 indicates a decoder for decoding the input bits, numeral 301 indicates an output terminal for extracting output currents and numeral 302 indicates an output terminal for extracting currents complementary to the currents outputted from the output terminal 301. Numeral 303 indicates a first bus which is connected to the output terminal 301. Numeral 304 indicates a second bus which is connected to the output terminal 302. Numerals 401 to 407 indicate constant current sources which are biased by bias voltage $V_B$ to generate equal unit currents; numerals 501 to 507 indicate switches provided in correspondence to the constant current sources 401 to 407, respectively; numerals 601 to 607 indicate control lines which receive control signals outputted from the decoder 2 to control switching of the corresponding switches 501 to 507; numeral 7 indicates a grounded point; numeral 70 indicates a grounding conductor, such as a grounding lead wire, numerals 701 to 707 indicate respective connection nodes between the constant current sources 401 to 407 and the grounding lead wire 70; and numeral 8 indicates a voltage input terminal for supplying the bias voltage $V_B$ to the constant current sources 401 to 407.

Description is now made on the operation of the digital-to-analog converter as shown in FIG. 1. Assuming that symbol $I_0$ represents the unit current flowing in the respective one of the constant current sources 401 to 407, the grounded point 7 receives the current of $7I_0$. On the other hand, the current flowing to the output terminal 301 is changed by switching states of the switches 501 to 507 in eight stages of 0, $I_0$, $2I_0$, $3I_0$, $4I_0$, $5I_0$, $6I_0$ and $7I_0$, which represent the amount of the analog signal outputted from the digital-to-analog converter. In case where the inputted signal $D_2D_1D_0$ is in the bit value of "011" representing the numerical value "3" in decimal, arbitrary three of the switches 501 to 507 are leftwardly turned while the remaining switches are rightwardly turned, so that current of $3I_0$ flow to the output terminal 301. In the conventional device as shown in FIG. 1, three switches 501, 502 and 503 are leftwardly turned sequentially from the left-hand direction so that the output terminal 303 outputs the current of $3I_0$ and the output terminal 302 outputs current of $4I_0(=7I_0-3I_0)$.

In the conventional digital-to-analog converter of the aforementioned construction, a voltage drop is caused by the grounding lead wire 70 since the resistance value thereof is not zero, that is, the grounding lead wire 70 has a prescribed length and it has inner-resistance along the length, so that the bias voltage actually applied to the respective constant current sources 401 to 407 is at the maximum level in the constant current source 401 which is closest to the grounded point 7 and at the minimum level in the constant current source 407 farthest from the grounded point 7.

FIG. 2 is a graph showing the amounts of the currents actually flowing in the respective constant current sources 401 to 407, and assuming that $I_0$ represents the mean value thereof, the amounts of the current actually flowing in the respective constant current sources 401 to 407 are different from the mean value $I_0$ by the voltage drops caused by the grounding lead wire 70. Therefore, when, for example, only the switches 501, 502 and 503 are leftwardly turned as shown in FIG. 1 so that the currents flow from the output terminal 301 to the constant current sources 401, 402 and 403, the sum total thereof is greater than $3I_0$. In general, this means that the digital-to-analog converter is degraded in linearity.

SUMMARY OF THE INVENTION

An object of the present invention is to provide a digital-to-analog converter which is excellent in linearity.

According to the present invention, constant current sources symmetrically positioned about the center of array of the constant current sources, i.e., that with respect to connection nodes between the constant current sources and a grounding conductor, are controlled sequentially to be connected to a first bus.

Currents actually flowing in two constant current sources mutually symmetrically positioned with respect to the center of array are in symmetrical relation substantially equally larger or smaller than the mean value due to the voltage drop function of the grounding conductor. Therefore, the constant current sources symmetrically positioned to each other are selected to be connected to the first bus by selecting means so that the currents flowing in the constant current sources, which are larger and smaller than the mean value, can be cancelled with each other.

Consequently, the digital-to-analog converter can be improved in linearity.

These and other objects, features, aspects and advantages of the present invention will become more apparent from the following detailed description of the present invention when taken in conjunction with the accompanying drawings.

DESCRIPTION OF THE PREFERRED EMBODIMENTS

Description is now made on embodiments of the present invention with reference to the accompanying drawings.

Figure 1:
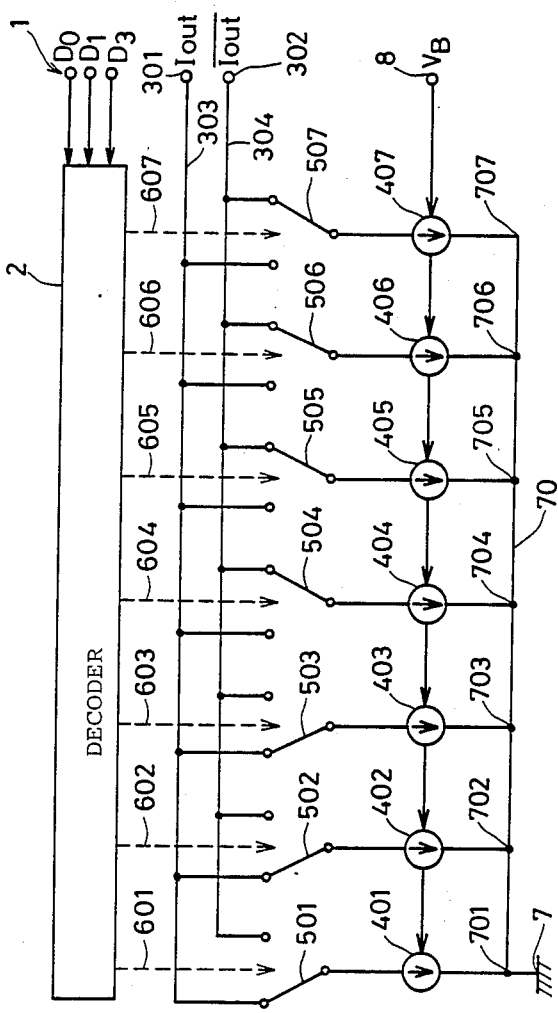
FIG. 1 illustrates an example of a conventional digital-to-analog converter.
Figure 2:
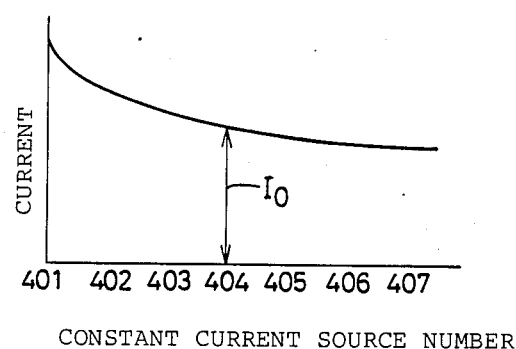
FIG. 2 is a graph showing currents actually flowing in respective constant current sources as shown in FIG. 1.
Figure 3:
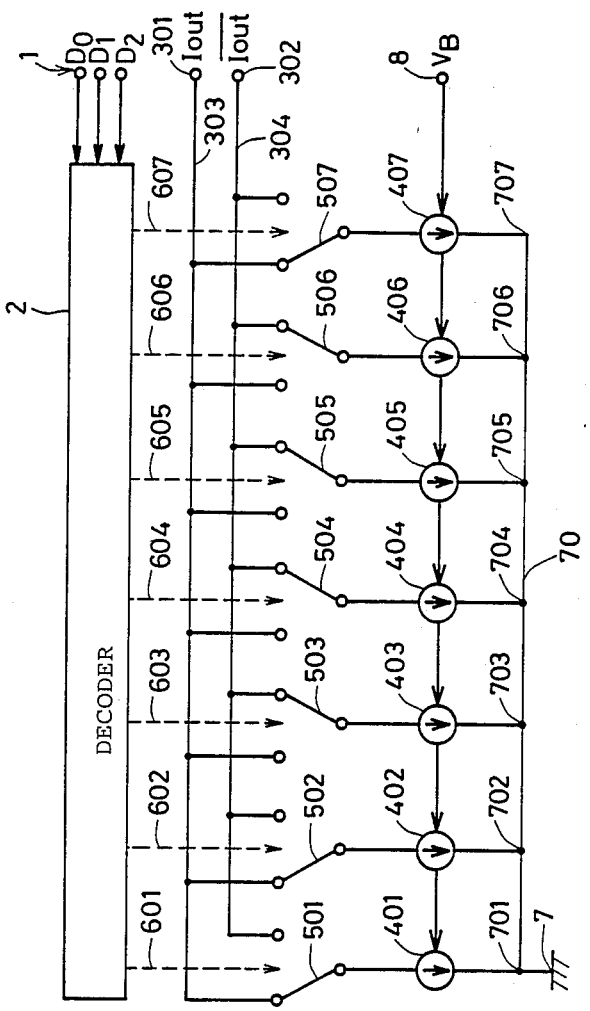
FIG. 3 illustrates an embodiment of the present invention.

FIG. 3 illustrates an embodiment of the present invention. Referring to FIG. 3, numerals identical to those in FIG. 1 indicate the same or corresponding components. In the circuit as shown in FIG. 3, a decoder 2 outputs control signals 601 to 607 in different order from that of the conventional case. More specifically, constant current sources symmetrically positioned with respect to the center of array thereof are sequentially connected to or cut off from a first bus 303 to be connected to a second bus 304.

TABLE 1

| Input Digital Value | Switch Newly Selected to be Connected to First Bus |
|---|---|
| 000 | None |
| 001 | 501 |
| 010 | 507 |
| 011 | 502 |
| 100 | 506 |
| 101 | 503 |
| 110 | 505 |
| 111 | 504 |

Table 1 shows switches newly selected to be connected to the first bus 303 when three-bit digital signal $D_2D_1D_0$ is sequentially increased in value. When the digital signal $D_2D_1D_0$ is "000", all of the switches 501 to 507 are connected to the second bus 304. Assuming that the switch 501 is selected when the digital signal $D_2D_1D_0$ is changed from "000" to "001", then the switch 507 symmetrically positioned to the switch 501 with respect to the center of array is selected when the digital signal $D_2D_1D_0$ is changed from "001" to "010", whereby the current error of a constant current source 401 is substantially cancelled by that of a constant current source 407. If the switch 502 is selected when the digital signal $D_2D_1D_0$ is changed from "010" to "011" as in the example shown in FIG. 1, then the switch 506 symmetrically positioned to the switch 502 is selected when the digital signal $D_2D_1D_0$ is changed from "011" to "100".

When the input digital signal $D_2D_1D_0$ is sequentially decreased in value, the switches 501 to 507 may be connected to the second bus 304 in reverse order to the above.

Figure 4:
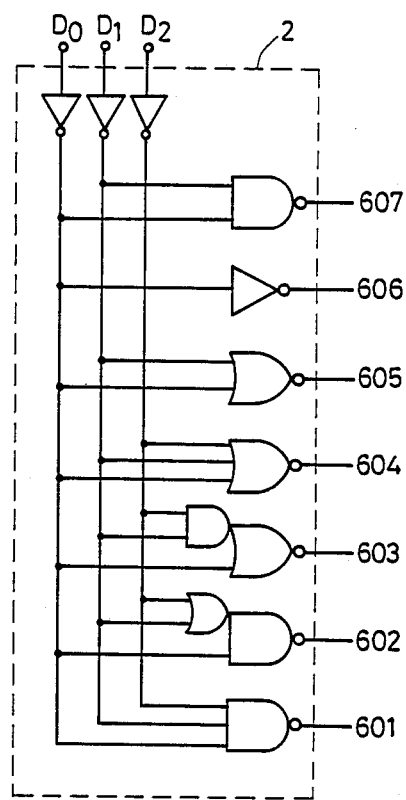
FIG. 4 illustrates an exemplary circuit configuration of a decoder 2 as shown in FIG. 3.

FIG. 4 shows an exemplary circuit configuration of the decoder 2 as shown in FIG. 3. As shown in FIG. 4, the decoder 2 can be formed by combining logic gates such as inverter, NAND gate, NOR gate, AND gate, OR gate and the like.

TABLE 2

| Input | $D_0$ | 0 0 0 0 1 1 1 1 | |
|---|---|---|---|
| | $D_1$ | 0 0 1 1 0 0 1 1 | |
| | $D_2$ | 0 1 0 1 0 1 0 1 | Order of Selection |
| 607 | | 0 0 1 1 1 1 1 1 | 2 |
| 606 | | 0 0 0 0 1 1 1 1 | 4 |
| 605 | | 0 0 0 0 0 0 1 1 | 6 |
| 604 | | 0 0 0 0 0 0 0 1 | 7 |
| 603 | | 0 0 0 0 0 1 1 1 | 5 |
| 602 | | 0 0 0 1 1 1 1 1 | 3 |
| 601 | | 0 1 1 1 1 1 1 1 | 1 |

Table 2 shows a truth table of respective outputs 601 to 607 of the decoder 2 as shown in FIG. 4. Referring to Table 2, the switches 501 to 507 connect the constant current sources 401 to 407 to the first bus 301 when the logic "1" is outputted. It is understood that the results as shown in Table 1 are obtained from Table 2.

Although the switches 501 to 507 are sequentially controlled from that in either end of the array to that in the center thereof in order of selection as shown in Table 1, the same may be controlled sequentially from that in the center to that in either end. In this case, the right columns of Table 1 are changed as "none", "504", "503", "505", ...

Although the constant current sources 401 to 407 are one-dimensionally arrayed in the aforementioned embodiment, the same may be two-dimensionally arrayed on condition that the constant current sources symmetrically positioned with respect to the center of array are sequentially connected to the first bus.

Figure 5:
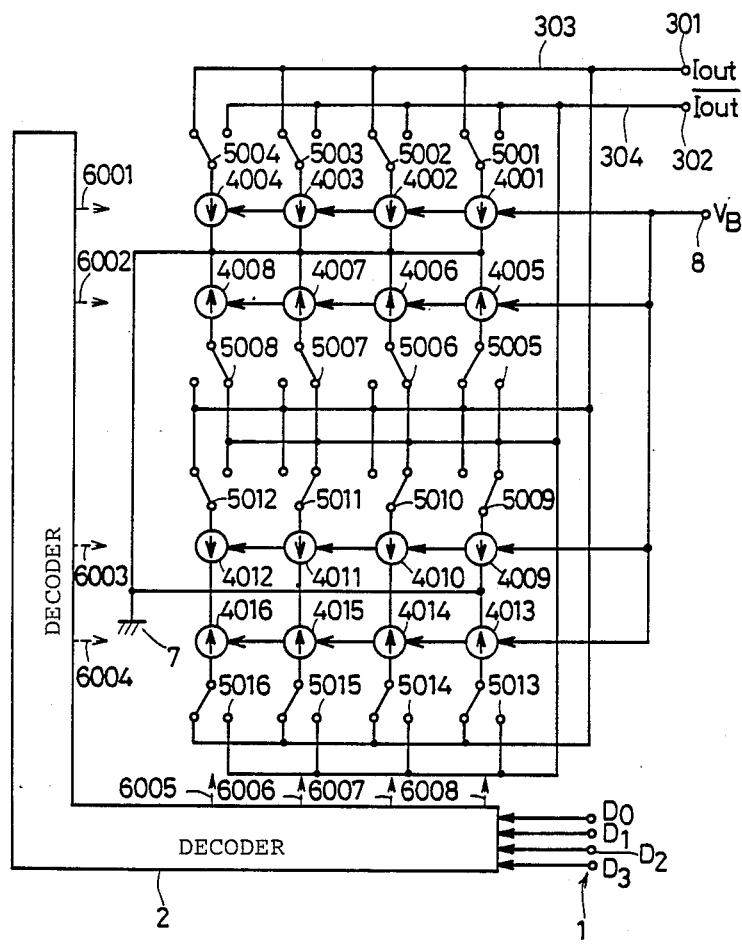
FIG. 5 illustrates another embodiment of the present invention.

FIG. 5 shows another embodiment of the present invention in which constant current sources are in two-dimensional array.

In FIG. 5, numerals identical to those in FIG. 3 indicate corresponding components. Numerals 4001 to 4016 indicate two-dimensionally arrayed constant current sources, numeral 5001 to 5006 indicate switches and numerals 6001 to 6004 and 6005 to 6008 indicate control lines for performing two-dimensional control.

TABLE 3

| Input Digital Value | Constant Current Source newly Selected to be Connected to First Bus |
|---|---|
| 0000 | None |
| 0001 | 4001 |
| 0010 | 4016 |
| 0011 | 4002 |
| 0100 | 4015 |
| 0101 | 4003 |
| 0110 | 4014 |
| 0111 | 4004 |
| 1000 | 4013 |
| 1001 | 4005 |
| 1010 | 4012 |
| 1011 | 4006 |
| 1100 | 4011 |
| 1101 | 4007 |
| 1110 | 4010 |
| 1111 | 4008 |

Table 3 shows the constant current sources newly selected to be connected to a first bus 303 when four-bit input digital signal $D_3D_2D_1D_0$ is sequentially increased in value in the device as shown in FIG. 5. The constant current source 4016 is center-symmetrically positioned with respect to the constant current source 4001 while the constant current source 4015 is center-symmetrically positioned with respect to the constant current source 4002, and hence the relation between FIG. 5 and Table 3 is easily understood on the basis of the relation between FIG. 3 and Table 1. Thus, detailed description of this embodiment is omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A digital-to-analog converter, comprising:
a plurality of constant current sources adapted to generate equal constant currents, said plurality of constant current sources being arrayed in a prescribed order;
a grounding conductor haivng an internal resistance distributed along its length and connected with said constant current sources so that currents generated from respective ones of said plurality of constant current sources flow into different positions of said grounding conductor along said array of constant current sources, an end of said grounding conductor being grounded;

a first bus including an output terminal for analog signals generated by said converter;

a second bus including an output terminal for analog signals complementary to said converted analog signals;

a plurality of switching means respectively provided in correspondence to said constant current sources for switching said first bus and said second bus to obtain currents flowing into said constant current sources;

decoder means for decoding input digital signals thereby to output switching control signals for respective ones of said switching means; and control means for controlling said switching means in response to said decoder means to switch said plurality of constant current sources symmetrically with respect to the center of said array to said first bus.

2. A digital-to-analog converter in accordance with claim 1, wherein said control means is adapted to control said switching means in response to said decoder means so that said constant current sources connected with said grounding conductor in a position closest to or farthest from said grounded end, second closest to or farthest from said grounded end, third closest to or farthest from said grounded end, and so on, are sequentially selected to be connected to said first bus.

3. A digital-to-analog converter in accordance with claim 1, wherein said control means is adapted to control said switching means in response to said decoder means so that said constant current source connected with said grounding conductor in a position closest to said center of array, second closest to said center of array, third closest to said center of array, and so on, are sequentially selected to be connected to said first bus.

4. A digital-to-analog converter, comprising:

a plurality of constant current sources controlled by applied bias voltages, said plurality of constant current sources being arrayed in a prescribed order;

a grounding conductor connected with said constant current sources so that currents generated from respective ones of said plurality of constant current sources flow into different positions of said grounding conductor along said array of said constant current sources, an end of said grounding conductor being grounded;

a first bus including an output terminal for converted analog signals generated by said converter;

a second bus including an output terminal for analog signals complementary to said converted analog signals;

a plurality of switching means provided in correspondence respectively to said constant current sources for switching said first bus and said second bus to obtain current flowing into said constant current sources;

decoder means for decoding input digital signals thereby to output switching control signals for said switching means; and control means for controlling said switching means in response to said decoder means so that within said plurality of constant current sources, pairs thereof having relatively large currents due to voltage drops caused by said grounding conductor and pairs thereof having relatively small currents due to voltage drops caused by said grounding conductor are alternately selected to be connected to said first bus.

* * * * *